(12) United States Patent
Eissler et al.

(10) Patent No.: US 8,946,761 B2
(45) Date of Patent: Feb. 3, 2015

(54) RADIATION-EMITTING SEMICONDUCTOR CHIP AND METHOD FOR PRODUCING A RADIATION-EMITTING SEMICONDUCTOR CHIP

(75) Inventors: Dieter Eissler, Shanghai (CN); Andreas Ploessl, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 7 days.

(21) Appl. No.: 13/811,847

(22) PCT Filed: Jul. 15, 2011

(86) PCT No.: PCT/EP2011/062158
§ 371 (c)(1),
(2), (4) Date: Apr. 29, 2013

(87) PCT Pub. No.: WO2012/013523
PCT Pub. Date: Feb. 2, 2012

(65) Prior Publication Data
US 2013/0214322 A1    Aug. 22, 2013

(30) Foreign Application Priority Data
Jul. 28, 2010  (DE) .................... 10 2010 032 497

(51) Int. Cl.
*H01L 33/00* (2010.01)
*H01L 33/62* (2010.01)
(Continued)

(52) U.S. Cl.
CPC ............ *H01L 33/62* (2013.01); *H01L 33/0079* (2013.01); *H01L 33/382* (2013.01); *H01L 33/20* (2013.01); *H01L 33/22* (2013.01); *H01L 2924/0002* (2013.01)

USPC ................................ 257/99; 438/26

(58) Field of Classification Search
CPC ....... H01L 33/62; H01L 33/382; H01L 33/20; H01L 33/0079
USPC ................................ 257/99; 438/26
See application file for complete search history.

(56) References Cited

U.S. PATENT DOCUMENTS 5,917,196 A  *  6/1999  Teraguchi ................... 257/22
8,581,276 B2 * 11/2013  Lee et al. ..................... 257/94
(Continued)

FOREIGN PATENT DOCUMENTS

DE    10 2007 019 775 A1    10/2008
DE    10 2007 057 756 A1     6/2009
(Continued)

OTHER PUBLICATIONS

Liu, Q.Z., et al., "A Review of the Metal-GaN Contact Technology," Solid-State Electronics, vol. 42, No. 5, 1998, pp. 677-691.
(Continued)

*Primary Examiner* — Tu-Tu Ho
(74) *Attorney, Agent, or Firm* — Slater & Matsil, L.L.P.

(57) ABSTRACT

A radiation-emitting semi-conductor chip has a substrate and a semiconductor body arranged on the substrate and with a semiconductor layer sequence that includes an active region provided for producing radiation, an n-type region, and a covering layer arranged on a side of the n-type region that faces away from said active region. There is a contact structure arranged on the covering layer for the external electrical contacting of the n-type region. The covering layer has at least one recess through which the contact structure extends to the n-type region.

15 Claims, 5 Drawing Sheets

(51) Int. Cl.
*H01L 33/38* (2010.01)
*H01L 33/20* (2010.01)
*H01L 33/22* (2010.01)

(56) References Cited

U.S. PATENT DOCUMENTS

| | | |
|---|---|---|
| 2003/0102484 A1 | 6/2003 | Hata et al. |
| 2003/0116770 A1 | 6/2003 | Chang et al. |
| 2003/0141512 A1 | 7/2003 | Bruderl et al. |
| 2004/0099873 A1* | 5/2004 | Illek ................ 257/98 |
| 2005/0199891 A1 | 9/2005 | Kunisato et al. |
| 2006/0102972 A1* | 5/2006 | Bhattacharyya ........... 257/432 |
| 2007/0190290 A1* | 8/2007 | Gunther et al. ............ 428/138 |
| 2008/0042149 A1* | 2/2008 | Yoon et al. .............. 257/79 |
| 2009/0026486 A1 | 1/2009 | Jinushi |
| 2009/0321775 A1* | 12/2009 | Hasnain ................ 257/99 |
| 2010/0219442 A1* | 9/2010 | Lee ................... 257/99 |
| 2011/0127489 A1* | 6/2011 | Lee et al. ............. 257/13 |
| 2011/0204322 A1 | 8/2011 | Weiss et al. |
| 2013/0221392 A1 | 8/2013 | Engl et al. |

FOREIGN PATENT DOCUMENTS

| | | |
|---|---|---|
| DE | 10 2008 039 790 A1 | 3/2010 |
| JP | 2003-124517 A | 4/2003 |
| JP | 2003-174193 A | 6/2003 |
| JP | 2005-197289 A | 7/2005 |
| JP | 2005-259832 A | 9/2005 |
| JP | 2007-103690 A | 4/2007 |
| JP | 2008-047858 A | 2/2008 |
| JP | 2010-525585 A | 7/2010 |
| JP | 2011-187872 A | 9/2011 |
| JP | 2011-187873 A | 9/2011 |
| WO | WO 2005/081319 A1 | 9/2005 |
| WO | WO 2008/131736 A1 | 11/2008 |
| WO | WO 2008/131743 A1 | 11/2008 |
| WO | WO 2010/012267 A1 | 2/2010 |

OTHER PUBLICATIONS

Schnitzer, I., et al., "30% External Quantum Efficiency from Surface Textured, Thin-film Light-emitting Diodes," Applied Physics Letters, vol. 63, No. 16, Oct. 18, 1993, pp. 2174-2176.

* cited by examiner

RADIATION-EMITTING SEMICONDUCTOR CHIP AND METHOD FOR PRODUCING A RADIATION-EMITTING SEMICONDUCTOR CHIP

This patent application is a national phase filing under section 371 of PCT/EP2011/062158, filed Jul. 15, 2011, which claims the priority of German patent application 10 2010 032 497.3, filed Jul. 28, 2010, each of which is incorporated herein by reference in its entirety.

TECHNICAL FIELD

The present application relates to a radiation-emitting semiconductor chip.

BACKGROUND

In the case of the epitaxial deposition of semiconductor layers for radiation-emitting semiconductor chips, for example luminescence diodes, buffer layers and/or growth layers, which promote the epitaxial growth, are often deposited to increase the crystalline quality prior to deposition of the component layers which determine the optoelectronic properties. These layers can make the electrical contacting of the component layers more difficult owing to their comparatively low electrical conductivity.

SUMMARY OF THE INVENTION

In one aspect, a radiation-emitting semiconductor chip can be electrically contacted more easily and can be produced in a reliable manner. Furthermore, a method for producing such a radiation-emitting semiconductor chip is provided.

According to one embodiment, a radiation-emitting semiconductor chip has a carrier and a semiconductor body which is disposed on the carrier and has a semiconductor layer sequence. The semiconductor layer sequence includes an active region provided to generate radiation, an n-conducting region and a cover layer disposed on a side of the n-conducting region facing away from the active region. A contact structure for external electrical contacting of the n-conducting region is disposed on the cover layer and the cover layer has at least one cut-out through which the contact structure extends to the n-conducting region.

The electrical contacting of the n-conducting region thus takes place through the cut-out. Therefore, the electrical contacting can take place independently of the electrical conductivity of the cover layer. The cover layer can thus be optimised with respect to other physical properties. In particular, the cover layer can be formed as a growth layer and/or as a buffer layer during production of the radiation-emitting semiconductor chip. Upon application of an external electrical voltage during operation of the radiation-emitting semiconductor chip it is possible, by means of the cut-out, to avoid an undesirably high voltage drop occurring at the cover layer and thereby adversely affecting its ability to function. The efficiency of the radiation generation can thus be increased.

Furthermore, a removal of large areas of the cover layer may be dispensed with. The risk of breakage during production of the semiconductor chip is thereby reduced and the mechanical stability of the semiconductor chip is also increased.

In other words, by means of contacting the n-conducting region through cut-outa cut-out in the cover layer, efficient electrical contacting while retaining the optical, electrical and/or mechanical properties of the cover layer can be achieved.

A surface of the cover layer facing away from the active region preferably forms a first main surface of the semiconductor body, wherein the semiconductor body is delimited in the vertical direction, i.e., in a direction extending perpendicular to a main plane of extension of the semiconductor layers of the semiconductor body, by the first main surface.

The contact structure is therefore disposed on the semiconductor body outside the epitaxial semiconductor body and serves, during operation of the semiconductor chip, for the injection of charge carriers into the active region of the semiconductor body.

At least on the side facing the n-conducting region, the cover layer is preferably lattice-matched to the n-conducting region. During production, the cover layer can thus fulfil the function of a buffer layer and/or of a nucleation layer to increase the crystalline quality of the active region.

During production of the semiconductor body the deposition of the cover layer can thus take place prior to the deposition of the n-conducting region.

In a preferred embodiment, the cover layer is undoped or has a doping concentration of at the most $1*10^{17}$ cm$^{-3}$. By means of such a cover layer it becomes easier to achieve a high crystal quality during production of the semiconductor body. By reason of the cut-out in the cover layer, no significant portion of the operating voltage falls at the cover layer in spite of the comparatively high resistance of a cover layer with such a low doping concentration.

In a preferred embodiment, the carrier is disposed on the side of the active region facing away from the n-conducting region and, furthermore, is preferably cohesively connected to the semiconductor body.

In the case of a cohesive connection the—preferably prefabricated—connection partners are held together by means of atomic and/or molecular forces. A cohesive connection can be achieved, for example, by means of a connecting layer which can contain, for example, an adhesive or a solder. Separation of the connection usually results in the destruction of the connecting layer and/or of at least one of the connecting partners.

The carrier is preferably different from the growth substrate. The carrier thus does not have to fulfil the high crystalline requirements for a growth substrate but can be selected with regard to other properties, for example, mechanical stability, thermal conductivity, or the fact that it is available in large surface areas and inexpensively. A semiconductor chip in which the growth substrate is removed completely or at least in regions or is at least thinned is also referred to as a thin-film semiconductor chip.

A thin-film semiconductor chip, such as a thin-film light-emitting diode chip, can also be characterised within the scope of the present application by at least one of the following characteristic features:

on a first main surface of a semiconductor layer body, which includes a semiconductor layer sequence, in particular an epitaxial layer sequence, with an active region, facing a carrier element, for example the carrier, a minor layer is applied or the mirror layer is integrated in the layer sequence, for instance as a Bragg mirror, which mirror layer reflects at least a part of the radiation generated in the semiconductor layer sequence back therein;

the semiconductor layer sequence has a thickness in the range of 20 µm or less, in particular in the range of 10 µm; and/or the semiconductor layer sequence contains at least one semiconductor layer with at least one surface which has a mixing structure which ideally leads to an almost ergodic distribution of the light in the semiconductor layer sequence, that is to say it has the most ergodically stochastic scattering behaviour possible.

A basic principle of a thin-film light-emitting diode chip is described, for example, in I. Schnitzer et al., Appl. Phys. Lett. 63 (16), 18 Oct. 1993, 2174-2176, the disclosure content of which is in this respect hereby incorporated by reference into the present application.

In a further preferred embodiment a side surface of the at least one cut-out is provided with a coating.

The coating can contain, for example, a dielectric material such as an oxide, a nitride or an oxynitride.

The refraction index of the dielectric material is preferably low with respect to the adjoining material of the semiconductor body. The greater the difference between the refraction indices, the greater the portion of that radiation which is totally reflected in the case of radiation in the direction of the cut-out on the dielectric material and which can subsequently exit the semiconductor chip.

In a further preferred embodiment, the contact structure is formed at least in regions to be reflective for the radiation generated in the active region.

In a preferred embodiment, the contact structure has a connection layer, which adjoins the n-conducting region, and a reflector layer. The material for the connection layer is expediently selected with respect to good layer adhesion and/or a good contact property with respect to the semiconductor body. For example, the connection layer can contain aluminum or titanium.

For the radiation generated in the active region, the reflector layer preferably has a high level of reflectivity which is, in particular, largely independent of the angle of incidence. The reflector layer preferably contains a metal or metal alloy. For example, silver, aluminum, rhodium, palladium or chromium are characterised by a high level of reflectivity in the visible spectral range. Gold is suitable, in particular, for the infrared spectral range.

In a further preferred embodiment, the contact structure has a contact surface for the external electrical contacting of the semiconductor chip, for example, for a wire bond connection. The contact surface preferably closes the contact structure in the vertical direction on the side facing away from the semiconductor body.

In a further preferred embodiment, the at least one cut-out extends at least in regions along a periphery of the contact surface when the semiconductor chip is seen in a top view. By means of such cut-outa cut-out it is possible to avoid radiation generated in the active region being absorbed by the contact structure in the region of the contact surface. In the case of a component with such a semiconductor chip, in which the semiconductor chip is embedded in a casting, an absorption of radiation, which is scattered in the casting, for example on radiation-converter material or diffuser material, and coupled back into the semiconductor chip, can also be reduced. The whole radiation output exiting the semiconductor chip or the component can thus be increased.

For example, the at least one cut-out can extend around the contact surface in a frame-like manner or in an annular manner in the case of a round contact surface.

In a further preferred embodiment, the cover layer has a plurality of cut-outs in which the contact structure in each case adjoins the n-conducting region.

By means of the plurality of cut-outs a distribution of the current impressed into the semiconductor chip during operation can be achieved over a large surface and in a uniform manner in a lateral direction, i.e., in a direction extending along a main plane of extension of the semiconductor layer sequence. In a preferred development at least two of the cut-outs overlap with the contact surface when the semiconductor chip is seen in a top view. The contact surface thus covers at least two of the cut-outs. By means of the cut-outs it is possible in this case for the stability of the semiconductor chip to be increased during contacting. In particular, the contact surface can have a pattern which follows the cut-outs. As a result of a plastic deformation of the wire bond, this can lead to improved toothing of the wire bond connection with the semiconductor chip. For example, it is possible by means of the cut-outs for a nubbed structure with protrusions and/or depressions to be formed. The degree of toothing can be adjusted by means of the spatial density of the cut-outs and/or by means of a filling level of the cut-outs with the material of the contact structure.

In a further preferred embodiment the contact structure has a distribution layer. The distribution layer can be provided to connect a plurality of cut-outs in the cover layer to each other in an electrically conductive manner.

The distribution layer can be formed over the whole surface of the semiconductor body or only in regions, for example in a stud-like manner in at least one region.

A suitable material for the distribution layer is, for example, a metal, a semimetal or a transparent conductive oxide (TCO).

In a preferred embodiment, the cover layer has a structuring which is provided, in particular, to increase the coupling-out efficiency of the radiation generated in the semiconductor chip. Also in a preferred manner, the structuring is formed only in regions on the cover layer. At least in one region, in which the contact structure is formed, the cover layer is preferably unstructured. The structuring can be, for example, in the form of roughening or of regular structuring.

An unstructured surface of the cover layer in the region of the contact structure can effect a particularly simple and reliable wire bond assembly. In particular, comparatively small layer thicknesses suffice for the contact structure since the structuring does not have to be planarized by means of a thick contact structure. In this way, material for the deposition of the contact structure can be saved during production. Furthermore, a contact structure with a smooth surface has a higher level of reflectivity than a contact structure on a rough surface.

In other words, at least one light-coupling-out region can be defined on a radiation exit surface of the semiconductor chip, such as the first main surface, in which light-coupling-out region the cover layer comprises the structuring, wherein, in a region laterally adjoining the light-coupling-out region, the contact structure is formed on an unstructured region of the cover layer.

In a method for producing a plurality of semiconductor chips, in accordance with one embodiment, a semiconductor layer sequence is provided on a substrate and has a cover layer, an active region provided to generate radiation, and an n-conducting region. The semiconductor layer sequence is attached to a carrier. The substrate is removed. Cut-outs are formed in the cover layer. A contact structure is formed on the cover layer, wherein the contact structure extends into the cut-outs. The semiconductor layer sequence with the carrier is divided into a plurality of semiconductor chips, so that each semiconductor chip has at least one of the cut-outs.

The method does not necessarily have to be carried out in the order of the production steps as set out above.

The method is suitable, in particular, for production of a semiconductor chip described in more detail above, so that features described in conjunction with the semiconductor chip can also be drawn upon for the method and vice versa. With the method it is possible to produce semiconductor chips which are characterised by a high crystalline quality in the active region and at the same time by a good level of contactability in the n-conducting region.

In a preferred embodiment the contact structure is deposited by a galvanic process. In this way, resistant, hard contact surfaces, such as for a wire bond connection, can be produced easily and inexpensively.

BRIEF DESCRIPTION OF THE DRAWINGS

Further features, embodiments and expediencies are given by the following description of the exemplary embodiments in conjunction with the figures in which.

Identical, similar or identically acting elements are provided with the same reference numerals in the figures.

The figures and the size ratios of the elements shown in the figures are not to be considered as being to scale with respect to each other. It is rather the case that individual elements can be illustrated to an excessively large extent for the sake of better illustration and/or for better understanding.

DETAILED DESCRIPTION OF ILLUSTRATIVE EMBODIMENTS

Figure 1A:
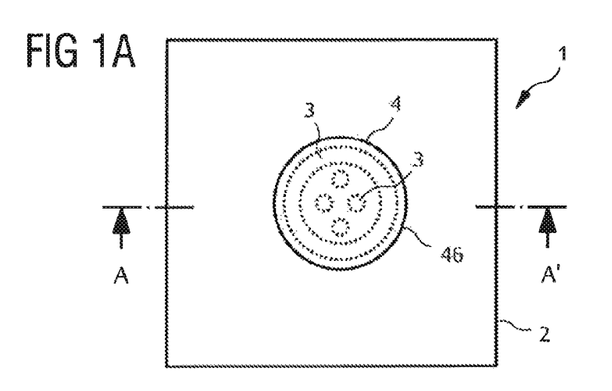
FIGS. 1A and 1B show a first exemplary embodiment for a radiation-emitting semiconductor chip in a schematic top view (FIG. 1A) and associated cross-sectional view (FIG. 1B)
Figure 1B:
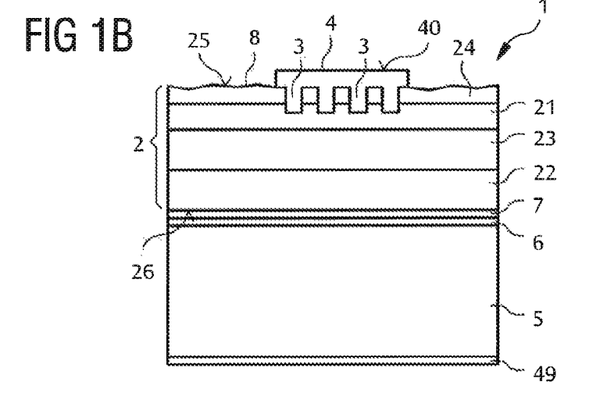

A first exemplary embodiment for a radiation-emitting semiconductor chip is schematically illustrated in FIGS. 1A and 1B. The semiconductor chip 1 includes a semiconductor body 2 with a semiconductor layer sequence which forms the semiconductor body. The semiconductor layer sequence is preferably deposited epitaxially such as by means of MBE or MOCVD.

The semiconductor body 2 is attached to a carrier 5 by means of a cohesive connection. The carrier is therefore different from a growth substrate for the semiconductor layer sequence of the semiconductor body. The semiconductor chip in this exemplary embodiment is thus formed as a thin-film semiconductor chip. In the vertical direction, i.e., in a direction extending perpendicular to a main plane of extension of the semiconductor layers of the semiconductor body 2, the semiconductor body extends between a first main surface 25 and a second main surface 26.

The semiconductor layer sequence of the semiconductor body 2 has an active region 23 provided to generate radiation and disposed between an n-conducting region 21 and a p-conducting region 22.

A cover layer 24 is formed on the side of the n-conducting region facing away from the active region. The cover layer closes the semiconductor body in the vertical direction. Furthermore, the cover layer has a lower doping concentration compared with the n-conducting region, for example, a doping concentration of at the most $1*10^{17}$ cm$^{-3}$.

A mirror layer 7 is disposed between the semiconductor body 2 and the carrier 5 and reflects the radiation generated in the active region 23 and emitted in the direction of the carrier 5, and deflects it in the direction of the first main surface 25. The first main surface 25 thus serves as a radiation exit surface.

In order to produce the cohesive connection a connecting layer 6, for example an adhesive layer or a solder layer, is formed between the semiconductor body 2 and the carrier 5.

At the side of the first main surface 25 the semiconductor body 2 has cut-outs 3 which extend through the cover layer into the n-conducting region 21 or at least to the n-conducting region. A contact structure 4 is formed in the cut-outs and adjoins the n-conducting region in the cut-outs 3 and is provided for external electrical contacting of the semiconductor chip.

Figure 2:
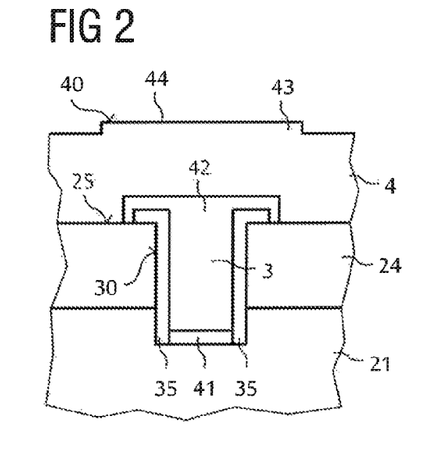
FIG. 2 shows an enlarged illustration of cut-outa cut-out in accordance with the first exemplary embodiment in a schematic side view.

The configuration of the cut-outs 3 is explained in more detail in conjunction with FIG. 2.

When the semiconductor chip is seen in a top view the contact structure 4 is formed in an exemplary manner as a circular contact structure. One of the cut-outs 3 is formed in an annular manner and follows a periphery 46 of the contact structure.

By means of this cut-out the portion of the radiation is reduced which is generated in the active region and would at least partially be absorbed below a contact surface 40 of the contact 4.

A counter contact 49 is formed on the side of the semiconductor chip lying opposite the contact structure 4. By means of the contact structure and the counter contact, charge carriers can be injected into the active region 23 from different sides during operation of the semiconductor chip and there recombine, emitting radiation.

The cover layer 24 has a structuring 8. The structuring is formed in the region of the first main surface of the semiconductor body 2 which is provided as a light exit region. The structuring can be effected, for example, mechanically and/or chemically.

In the region which covers the contact structure when the semiconductor chip is seen in a top view, the first main surface 25 is unstructured. The contact structure therefore has a smooth surface on the side facing the semiconductor body 2, whereby the reflectivity of the contact surface is increased.

The semiconductor body 2, in particular the active region 23, preferably has a III-V compound semiconductor material.

III-V semiconductor materials are particularly suitable for radiation generation in the ultraviolet ($Al_xIn_yGa_{1-x-y}N$) through the visible ($Al_xIn_yGa_{1-x-y}N$, in particular for blue to green radiation, or $Al_xIn_yGa_{1-x-y}P$, in particular for yellow to red radiation) to the infrared ($Al_xIn_yGa_{1-x-y}As$) spectral range. In association with this $0 \leq x \leq 1$, $0 \leq y \leq 1$ and $x+y \leq 1$ applies respectively, in particular with $x \neq 1$, $y \neq 1$, $x \neq 0$ and/or $y \neq 0$. With III-V semiconductor materials, in particular from the said material systems, high internal quantum effects can also be achieved during radiation generation.

In the illustrated exemplary embodiment the contacting of the p-conducting region 22 takes place over the surface through the carrier 5. In this case the carrier is expediently formed in an electrically conductive manner. For example, the carrier can contain a semiconductor material such as silicon, germanium or gallium arsenide. In a departure therefrom, however, an electrically insulating material can also be used for the carrier 5, for example sapphire or a ceramic such as aluminum nitride or boron nitride. In this case the electrical contacting of the p-conducting region 22 can take place, for example, through a cut-out in the carrier 5 or through an aperture in the semiconductor body 2 which extends from the first main surface 25 to the p-conducting region 22.

A section of cut-outa cut-out 3 in accordance with the first exemplary embodiment described in conjunction with FIGS. 1A and 1B is illustrated in a schematic cross-sectional view in FIG. 2.

A lateral expansion of the cut-outs 3 is preferably small with respect to the lateral expansion of the semiconductor chip 1. In contrast to a large surface or even full surface removal of the cover layer 24, the cut-outs 3 do not have a significant detrimental effect on the mechanical stability of the semiconductor chip. The lateral expansion of the aperture 3 preferably amounts at the most to 40 μm, in a particularly preferred manner at the most to 20 μm.

One side surface 30 of the cut-out 3 is provided with a coating 35. The coating preferably contains a dielectric material such as an oxide, for example silicon oxide or titanium oxide, a nitride, for example silicon nitride, or an oxynitride, for example silicon oxynitride.

The refraction index of the coating 35 is preferably lower than the refraction index of the semiconductor material adjoining the cut-out 3, so that the largest possible portion of the radiation emitted in the direction of the contact structure 4 is totally reflected at the side surface 30.

In a departure therefrom, however, it is also possible to dispense with such a coating. In this case the contact structure 4 adjoins the side surface 30 directly at the side surface 30.

The contact structure 4 has a connection layer 41 which adjoins the n-conducting region in the cut-out 3. The connection layer is expediently selected with respect to the material used in relation to the best possible layer adhesion to the semiconductor body 2 and in relation to a good electrical contact property. For example, aluminum or titanium is suitable. Further materials for a connection to an n-conducting region are described in the document Q. Z. Liu and S. S. Lau in Solid-State Electronics, vol. 42, no. 5, pp. 677-691 (1998), the disclosure content of which is in this respect hereby explicitly incorporated into the present application.

Furthermore, the contact structure 4 has a reflector layer 42 which is reflective for the radiation generated in the active region. For example, silver, aluminum, rhodium, chromium or palladium are suitable for the visible spectral range. In the infrared spectral range, gold is suitable, for example.

Furthermore, the contact structure 4 has a distribution layer 43. By means of the distribution layer, the contact surface 40 provided for external electrical contact is formed.

In a departure from the described exemplary embodiment, it is also possible to dispense with the distribution layer 43. In this case the contact surface 40 can be formed by means of the reflector layer.

A pattern which follows the arrangement of the cut-outs 3 is formed on the contact surface 40. The contact surface thus has respective protrusions 44 in the region of the cut-outs, so that a nubbed structure is produced. When producing a wire bond connection to the contact surface 40, it is possible for toothing to be effected through this nubbed structure, whereby the stability of the wire bond connection can be increased.

In a departure from the described exemplary embodiment, the apertures 3 can also be only partially filled. In this case a pattern can be produced on the contact surface 40, in which respective depressions are formed in the region of the cut-outs 3.

The pattern of the contact surface 40 can thus be adjusted by means of the filling level of the cut-outs and/or by means of the density of the cut-outs.

The described embodiment of the cut-out 3 and of the contact structure 4 can also be used for the exemplary embodiments described below in conjunction with the remainder of the figures.

Figure 3A:
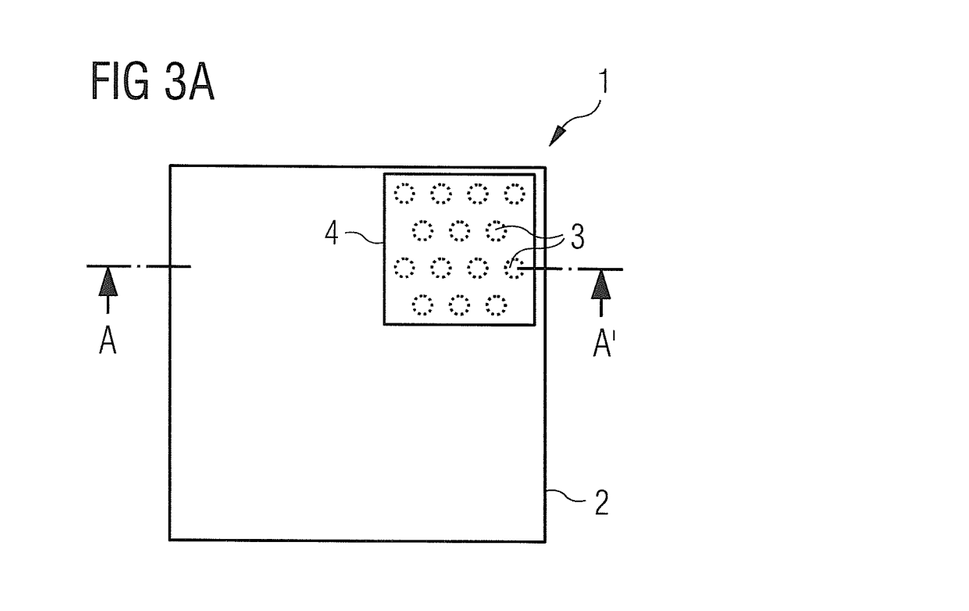
FIGS. 3A and 3B show a second exemplary embodiment for a radiation-emitting semiconductor chip in a schematic top view (FIG. 3A) and associated cross-sectional view (FIG. 3B)
Figure 3B:
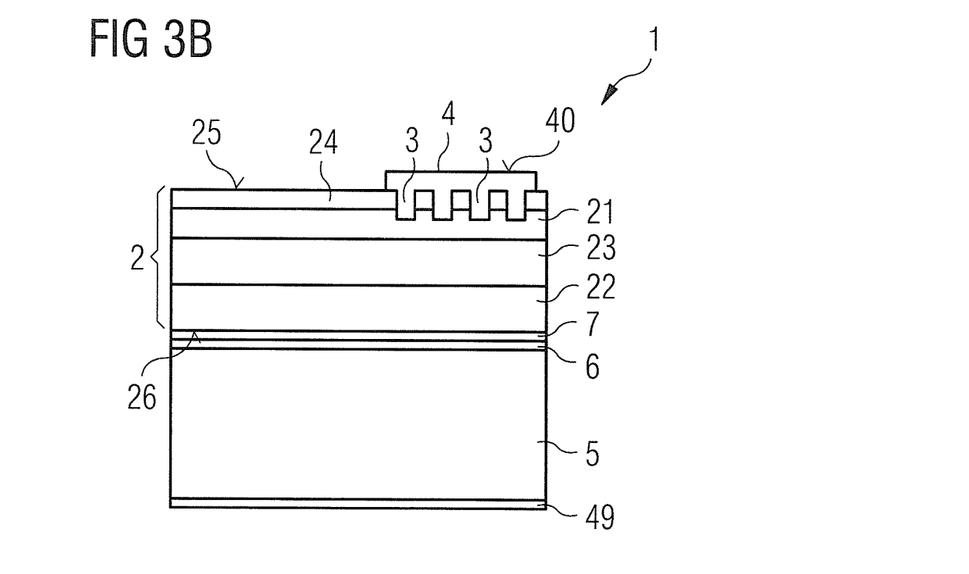

A second exemplary embodiment for a radiation-emitting semiconductor chip is shown in FIGS. 3A and 3B in a schematic top view and a schematic cross-sectional view. This second exemplary embodiment corresponds essentially to the first exemplary embodiment described in conjunction with FIGS. 1A and 1B.

In contrast thereto, the contact structure 4 is disposed in a corner region of the semiconductor chip 1. Thus it is possible to avoid a wire bond causing shading of the radiation exit surface.

Furthermore, in contrast to the first exemplary embodiment, no cut-out is provided extending along a periphery of the contact structure 4. Such a frame-like cut-out, however, can additionally be provided.

Figure 4:
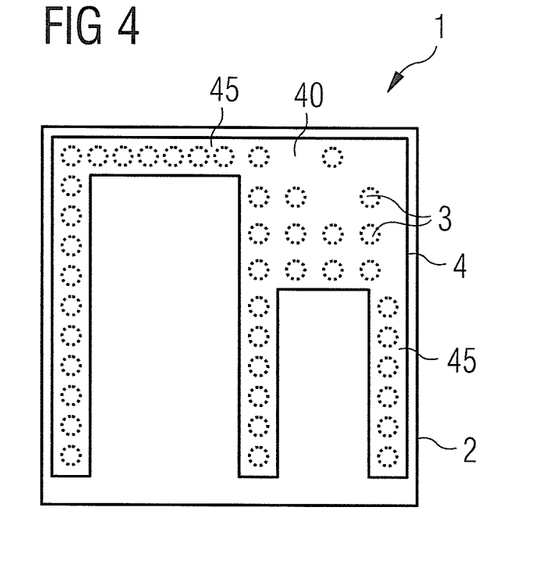
FIG. 4 shows a third exemplary embodiment for a radiation-emitting semiconductor chip in a schematic top view.

A third exemplary embodiment for a radiation-emitting semiconductor chip is illustrated schematically in a top view in FIG. 4. This third exemplary embodiment essentially corresponds to the second exemplary embodiment described in conjunction with FIG. 3. In contrast thereto, the contact structure 4 has stud-like regions 45 in addition to the contact surface 40 provided for external electrical contacting. The contact surface and the stud-like regions thus form a coherent structure.

When the semiconductor chip 1 is seen in a top view, cut-outs 3 are disposed in the region of the contact surface 40 and of the stud-like regions 45, which cut-outs are provided for electrical contacting of the n-conducting region.

By means of the cut-outs distributed over the semiconductor chip it is possible to achieve uniform injection of charge carriers over a large surface area via the n-conducting region 21 into the active region 23.

A metal, for example, such as gold, palladium, rhodium, silver, chromium or aluminum is suitable as the material for the stud-like region 45.

As described in relation to the exemplary embodiment shown in FIGS. 1A and 1B, regions of the cover layer can be provided with a structuring (not shown), wherein the regions of the contact surface 40 and of the stud-like regions 45 are preferably free of the structuring. In this way it is possible to achieve a smooth surface between the semiconductor body 2 and the contact structure 4, which smooth surface reflects the radiation more efficiently than a roughened surface.

Figure 5:
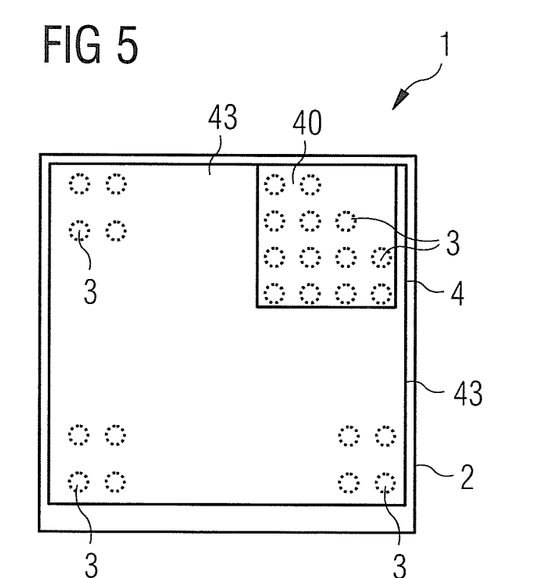
FIG. 5 shows a fourth exemplary embodiment for a radiation-emitting semiconductor chip in a schematic top view.

A fourth exemplary embodiment for a radiation-emitting semiconductor chip is illustrated in a schematic view in FIG. 5. This fourth exemplary embodiment corresponds essentially to the third exemplary embodiment described in conjunction with FIG. 4. In contrast thereto, the cut-outs 3 disposed outside the contact surface 40 when the semiconductor chip is seen in a top view are connected to each other in an electrically conductive manner by means of a distribution layer 43. Therefore, in the region of the semiconductor chip, charge carriers injected via the contact surface 40 are distributed over a large surface by means of the distribution layer 43 and are injected into the n-conducting region via the cut-outs 3. The distribution layer can be formed on the semiconductor body 2 over the whole surface or over substantially the whole surface or, in a departure therefrom, can cover only regions of the semiconductor body.

In particular, a material which is permeable to the radiation generated in the active region 23, for example a transparent conductive oxide, such as zinc oxide (ZnO) or indium tin oxide (ITO), is suitable for the distribution layer 43.

Alternatively or additionally, the distribution layer 43 can also have a metal layer which is so thin that it is at least translucent for the emitted radiation.

As described in conjunction with FIGS. 1A and 1B, the cover layer in this exemplary embodiment can also be provided with a structuring, wherein the structuring can also overlap with the distribution layer when the semiconductor chip 1 is seen in a top view.

An exemplary embodiment for a method for producing a radiation-emitting semiconductor chip is shown schematically in FIGS. 6A to 6D with the aid of cross-sectional views for different intermediate steps. For the sake of simplified illustration, only one part of a semiconductor layer sequence is shown, from which a semiconductor chip is made during production. Of course, a plurality of semiconductor chips can be produced simultaneously next to each other during production.

Figure 6A:
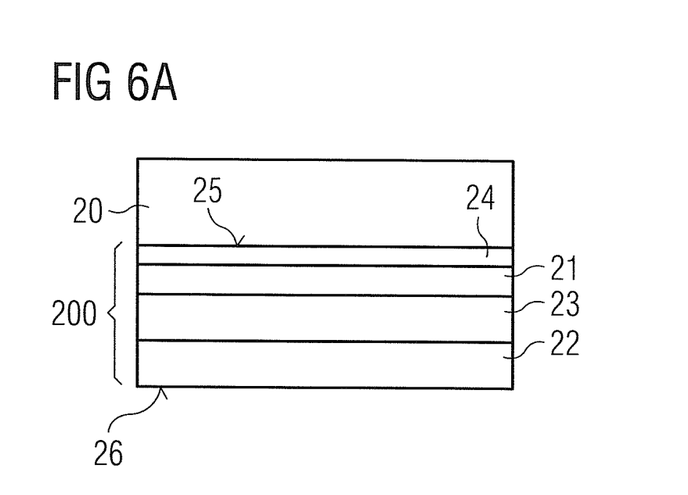
FIGS. 6A to 6D show an exemplary embodiment for a method for producing a semiconductor chip with the aid of intermediate steps illustrated schematically in cross-section.

A semiconductor layer sequence 200 is provided on a substrate 20. The semiconductor layer sequence 200 can be deposited on the substrate 20, for example, by means of an epitaxial deposition process such as MBE or MOVPE.

The semiconductor layer sequence 200 has a cover layer 24 which adjoins the substrate and fulfils the function of a buffer layer and/or of a nucleation layer promoting growth.

An n-conducting region 21, an active region 23 provided to generate radiation, and a p-conducting region 22 are deposited on the cover layer 24.

The cover layer 24 is lattice-matched to the n-conducting region at least on the side facing the n-conducting region.

Figure 6B:
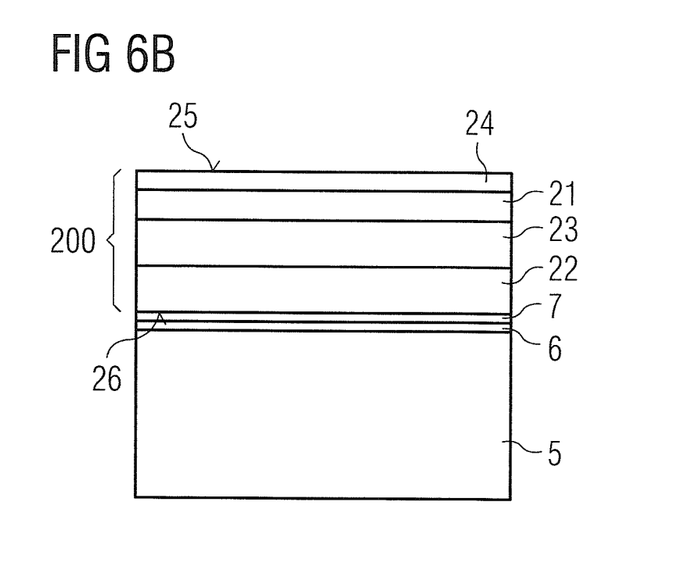

As shown in FIG. 6B, the semiconductor layer sequence is cohesively connected to the carrier 5 at a second main surface 26 facing away from the substrate 20. Between the carrier 5 and the semiconductor layer sequence 200 a mirror layer 7 is formed. This can be effected, for example, by means of sputtering or vapour deposition.

In particular, the materials mentioned in relation to the reflector layer 42 are suitable for the minor layer 7.

The carrier 5 serves for mechanical stabilisation of the semiconductor layer sequence 200, so that the substrate 20 is no longer required for this purpose and can be removed. By removing the substrate, the cover layer 24 is exposed.

Figure 6C:
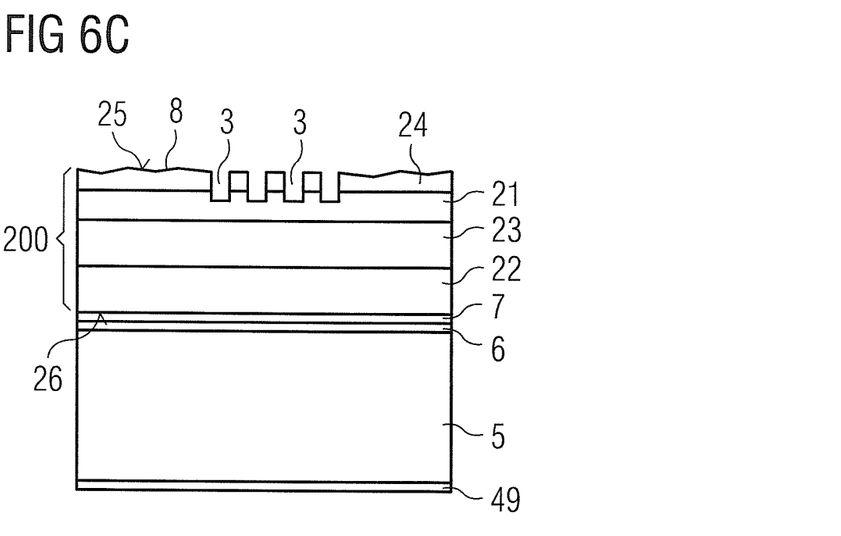

As shown in FIG. 6C, cut-outs 3 are formed in the first main surface 25 of the semiconductor layer sequence. For particularly small cut-outs with steep sides, dry chemical etching is particularly suitable. Alternatively or additionally, however, it is also possible to use a wet chemical etching process. The cut-outs 3 extend through the cover layer 24 into the n-conducting region 21.

Furthermore, the semiconductor layer sequence 200 is provided with a structuring 8 on the first main surface 25. The structuring preferably takes place only in regions of the first main surface, which are provided as light exit regions. Regions in which the contact structure is subsequently deposited are, in contrast, free of a structuring, so that the first main surface constitutes a smooth surface in these regions.

The light exit regions can be defined by means of a photolithographic process.

The structuring 8 can be effected, for example, by means of mechanical and/or chemical roughening. Regular structuring, for example by means of a photolithographic process, can also be used.

The deposition of the contact structure 4 can be effected, for example, by means of vapour deposition or sputtering on the prefabricated semiconductor layer sequence. Alternatively or additionally, however, it is also possible to use a galvanic deposition process. Particularly hard and resistant contact surfaces can be produced by galvanic deposition processes.

The contact structure 4 is preferably formed with multiple layers, wherein the layers can each contain a metal such as palladium, nickel, nickel phosphorous (Ni:P), copper or gold.

The galvanic deposition is described in document WO 2010/012267, the disclosure content of which in relation to this is incorporated by reference into the present application.

Figure 6D:
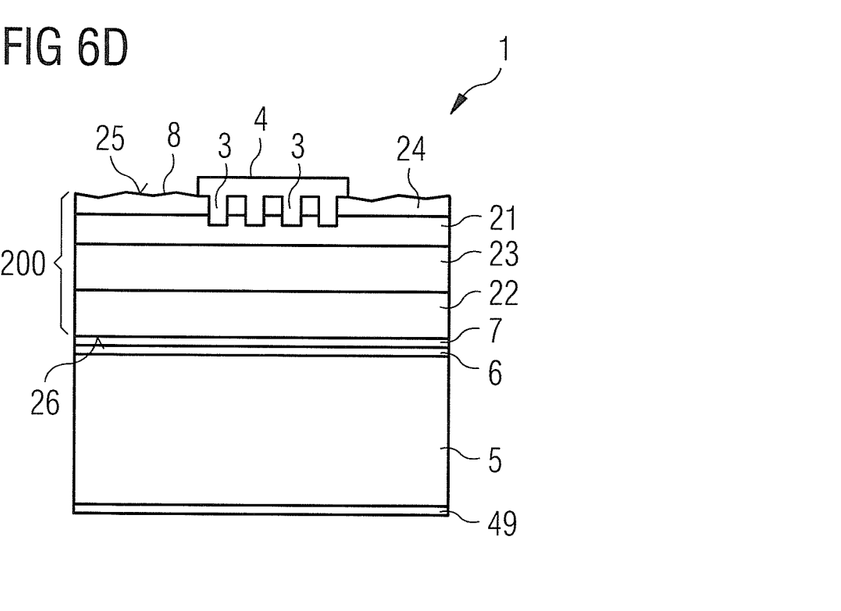

A produced semiconductor chip 1, which is made by division of the composite consisting of the semiconductor layer sequence 200 and carrier 5 into individual semiconductor chips, is schematically illustrated in a cross-sectional view in FIG. 6D.

In the described method, the cover layer 24 in the deposition of the semiconductor layer sequence can be selected with respect to a high crystal quality for the semiconductor layers, in particular for the active region. In the case of subsequent contacting of the n-conducting region, this takes place through at least one cut-out in the cover layer, so that the cover layer has no substantial influence on the electrical properties of the semiconductor chip. The cover layer 24 can thus remain in the semiconductor chip in spite of low electrical conductivity. It is therefore possible to dispense with complete removal, or removal at least over large surface regions, of the cover layer prior to deposition of the contact structure. The risk of breakage is thereby reduced to the greatest possible degree.

The invention is not limited by the description with the aid of the exemplary embodiments. It is rather the case that the invention includes each new feature and each combination of features included, in particular, in each combination of features in the claims even if this feature or this combination is not itself explicitly stated in the claims or the exemplary embodiments.

The invention claimed is:

1. A radiation-emitting semiconductor chip comprising:
    a carrier;
    a semiconductor body disposed on the carrier and having a semiconductor layer sequence that includes an active region configured to generate radiation, an n-conducting region and a cover layer disposed on a side of the n-conducting region facing away from the active region; and
    a contact structure for contacting the n-conducting region disposed on the cover layer, wherein the cover layer has a cut-out through which the contact structure extends to the n-conducting region, wherein the contact structure has a contact surface on a side facing away from the active region, wherein the contact surface overlaps in a plan view of the semiconductor chip with the cut-out, and wherein the contact surface has a protrusion or a depression.

2. The radiation-emitting semiconductor chip according to claim 1, wherein the cover layer delimits the semiconductor body in a vertical direction and is lattice-matched to the n-conducting region on the side facing the n-conducting region.

3. The radiation-emitting semiconductor chip according to claim 1, wherein the cover layer has a doping concentration of at most $1*10^{17}$ cm$^{-3}$.

4. The radiation-emitting semiconductor chip according to claim 3, wherein the cover layer is undoped.

5. The radiation-emitting semiconductor chip according to claim 1, wherein the carrier is disposed on a side of the active region facing away from the n-conducting region and is cohesively connected to the semiconductor body.

6. The radiation-emitting semiconductor chip according to claim 1, further comprising a coating disposed over a side surface of the cut-out.

7. The radiation-emitting semiconductor chip according to claim 6, wherein the coating contains a dielectric material.

8. The radiation-emitting semiconductor chip according to claim 1, wherein the contact structure has the contact surface for a wire bond connection.

9. The radiation-emitting semiconductor chip according to claim 8, wherein the cut-out extends at least in regions along a periphery of the contact surface in the plan view of the semiconductor chip.

10. The radiation-emitting semiconductor chip according to claim 8, wherein the cover layer has a plurality of cut-outs in which the contact structure adjoins the n-conducting region and wherein at least two of the cut-outs overlap with the contact surface in the plan view of the semiconductor chip.

11. The radiation-emitting semiconductor chip according to claim 10, wherein the contact surface has a pattern with protrusions and/or depressions, the pattern following the cut-outs.

12. The radiation-emitting semiconductor chip according to claim 1, wherein the cover layer has a plurality of cut-outs in which the contact structure adjoins the n-conducting region.

13. The radiation-emitting semiconductor chip according to claim 1, wherein a first portion of the cover layer is structured and wherein a second portion of the cover layer in which the contact structure is formed is unstructured.

14. A method for producing a plurality of semiconductor chips, the method comprising:
    providing a semiconductor layer sequence on a substrate, the semiconductor layer sequence comprising a cover layer, an active region configured to generate radiation, and an n-conducting region;
    attaching the semiconductor layer sequence to a carrier;
    removing the substrate;
    forming cut-outs in the cover layer;
    forming a contact structure on the cover layer, wherein the contact structure extends into the cut-outs, wherein the contact structure has contact surfaces on a side facing away from the active region, wherein the contact surfaces overlap in a plan view of the semiconductor chips the cut-outs, and wherein the contact surfaces have protrusions or depressions; and
    separating the semiconductor layer sequence with the carrier into the plurality of semiconductor chips, so that each semiconductor chip has at least one of the cut-outs.

15. The method according to claim 14, wherein forming the contact structure comprises depositing the contact structure using a galvanic process.

* * * * *